(12) United States Patent
Lee et al.

(10) Patent No.: US 11,735,440 B2
(45) Date of Patent: Aug. 22, 2023

(54) AUTOMATED WAFER CLEANING

(71) Applicant: Taiwan Semiconductor Manufacturing Co., Ltd., Hsinchu (TW)

(72) Inventors: Chun-Yu Lee, Hsin-Chu (TW); Sen-Yeo Peng, Hsin-Chu (TW); Chui-Ya Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/736,933

(22) Filed: May 4, 2022

(65) Prior Publication Data

US 2022/0262654 A1    Aug. 18, 2022

Related U.S. Application Data (63) Continuation of application No. 16/539,315, filed on Aug. 13, 2019, now Pat. No. 11,342,202.

(60) Provisional application No. 62/719,563, filed on Aug. 17, 2018.

(51) Int. Cl.

| | |
|---|---|
| *H01L 21/67* | (2006.01) |
| *H01L 21/687* | (2006.01) |
| *B08B 3/04* | (2006.01) |
| *H01L 21/02* | (2006.01) |
| *B08B 5/00* | (2006.01) |

(52) U.S. Cl.
CPC ........ *H01L 21/67051* (2013.01); *B08B 3/041* (2013.01); *B08B 5/00* (2013.01); *H01L 21/02057* (2013.01); *H01L 21/68764* (2013.01); *H01L 21/02087* (2013.01)

(58) Field of Classification Search
CPC .................................................. H01L 21/67051
See application file for complete search history.

(56) References Cited

U.S. PATENT DOCUMENTS

| | | |
|---|---|---|
| 9,165,799 B2 | 10/2015 | Wang |
| 2010/0154826 A1 | 6/2010 | Printz |
| 2016/0145761 A1 | 5/2016 | Mayer |

FOREIGN PATENT DOCUMENTS

| | | |
|---|---|---|
| TW | 201507017 A | 2/2015 |
| TW | 201513205 A | 4/2015 |
| TW | 201703881 A | 2/2017 |
| WO | 2010095848 A2 | 8/2010 |

*Primary Examiner* — Natasha N Campbell
(74) *Attorney, Agent, or Firm* — Duane Morris LLP (57) ABSTRACT

In an embodiment, a method includes: spinning a wafer around an axis of rotation at a center of the wafer; applying a first stream of liquid along a line starting from an initial point on the wafer adjacent to the center of the wafer, through the center of the wafer, and ending at an edge of the wafer; applying a second stream of liquid to an inner third of the line starting at the initial point and ending at a boundary point; applying a third stream of liquid to a middle third of the line starting at the boundary point; applying a fourth stream of liquid to an outer third of the line ending at the edge of the wafer; applying a fifth stream of liquid along the line starting from the initial point and ending at the edge of the wafer; and applying a stream of gas along the line starting from the initial point and ending at the edge of the wafer.

20 Claims, 10 Drawing Sheets

AUTOMATED WAFER CLEANING

CROSS-REFERENCE TO RELATED APPLICATION

This application is a division of U.S. patent application Ser. No. 16/539,315, filed Aug. 13, 2019, which claims priority to U.S. Provisional Patent Application No. 62/719,563, filed on Aug. 17, 2018, each of which are incorporated by reference herein in their entireties.

BACKGROUND

Integrated circuits are formed on wafers, or semiconductor substrates. The formation of the integrated circuits may include numerous processing steps such as deposition of various layers, etching, and bakes. The integrated circuits may be separated into individual dice, which are packaged and attached to circuit boards.

During the various processing steps to create the integrated circuits, various surfaces are formed on the surface of the wafer. Also, artifacts may be deposited along the surface of the wafer during processing. Accordingly, it may be desirable to clean the wafer of these artifacts in order to increase the production yield of the wafers.

One method of cleaning and drying wafers is spin cleaning. Spin cleaning involves dispensing a liquid cleaning solution onto the wafer and spinning the wafer to remove the solution, and thus, dry the wafer. The liquid cleaning solution is typically applied from a stationary nozzle as a stream orthogonal to the surface of the wafer. However, such spin cleaning may not be sufficient to remove all undesirable artifacts deposited on a wafer.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to automated wafer cleaning utilizing selective application of a liquid and gas to a spinning wafer. For ease of explanation, reference to a cleaning substance may refer to the application of either the cleaning liquid or gas. The selective application may include applications of the cleaning substance to the spinning wafer in a particular direction (e.g., as a stream at a particular angle relative to the surface of the wafer), location (e.g., adjacent to an axis of rotation around which the rotating wafer rotates), quantity (e.g., a particular number of streams of cleaning substance applied at a particular time), pressure, volume, region (e.g., within a particular region of a wafer during a particular time) and/or substance (e.g., a particular cleaning liquid or gas).

In certain embodiments, the cleaning substance may be applied as stream to a spinning wafer at a particular angle relative to the wafer's surface. This directional application may be at a non-orthogonal angle, or an angle other than 90 degrees or perpendicular to a surface of the wafer to be cleaned. However, the directional application may be at 90 degrees or perpendicular to the surface of the wafer to be cleaned in certain embodiments. Also, multiple dispensing nozzles may be utilized to apply the stream of cleaning substance to the wafer for wafer cleaning. When dispensed from multiple nozzles, the dispensed cleaning substance may contact the wafer at a same location or may contact the wafer at different locations (e.g., adjacent locations). Also, the stream of cleaning substance from a dispensing nozzle may be dispensed as a line (e.g., substantially terminating in a point on the wafer) or as a spray (e.g., substantially terminating in more than a point on the wafer, such as a line).

In performing wafer cleaning, the directional stream of cleaning substance may be applied from a middle or center of the spinning wafer (e.g., at the axis of rotation) to the edge of the spinning wafer. In certain embodiments, the directional stream of cleaning substance may be applied from a location offset or adjacent to the axis of rotation, and to cross the axis of rotation again in a straight line toward the edge of the wafer (e.g., an extremity of the wafer). In other embodiments, the directional stream of cleaning substance may be applied to thirds of the wafer across different increments of time. For example, the wafer may be divided into thirds along the radius, with an inner third closest to the center, an outer third farthest from the center, and a middle third between the inner third and the outer third. An amount of time of application for the directional stream of cleaning substance may be greatest, among each of the thirds, when applied to the outer third and least, among each of the thirds, when applied to the inner third. In certain embodiments, the application of the cleaning substance as a gas may be applied at a final step to dry, in addition to clean, the wafer while spinning. In various embodiments, the cleaning liquid may be deionized water and the cleaning gas may be nitrogen ($N_2$) gas or isopropyl alcohol (IPA).

In particular embodiments, automated wafer cleaning may include particular steps for cleaning the spinning wafer. As a first step, two non-orthogonal (e.g., not at 90 degrees from the wafer's surface) streams of cleaning liquid may be dispensed to terminate starting from a location slightly offset (e.g., adjacent to or within about $\frac{1}{30}^{th}$ of a wafer's diameter) from the wafer's center at the axis of rotation. The two non-orthogonal streams of cleaning liquid may be dispensed gradually across the wafer, by moving the nozzles in a linear motion (e.g., along a line), so that the streams cross through the center of the wafer and to an edge of the wafer. This step may be performed for a first duration of time. As a second step, a single stream of cleaning liquid may be dispensed by moving the nozzle in a linear motion so that the stream crosses an inner region of the wafer for a second duration of time. The second duration of time may be shorter than the first duration of time. As a third step, another single stream of cleaning liquid may be dispensed by moving the nozzle in a linear motion so that the stream crosses a middle region of the wafer for the second duration of time. The middle region may laterally surround the inner region. As a fourth step, yet another single stream of cleaning liquid may be dispensed by moving the nozzle in a linear motion so that the stream crosses an outer area of the wafer for the second duration of time. The outer area may laterally surround the middle area. As a fifth step, a single stream of cleaning liquid may be dispensed to terminate starting from a location slightly offset (e.g., adjacent to or within about $\frac{1}{30}^{th}$ of a wafer's diameter) from the wafer's center at the axis of rotation. The single stream of cleaning liquid may be dispensed gradually across the wafer, by moving the nozzle in a linear motion, so that the stream crosses through the center of the wafer and to an edge of the wafer. As a sixth and final step, a stream of gas may be dispensed to terminate starting from the location slightly offset (e.g., adjacent to or within about $\frac{1}{30}^{th}$ of a wafer's diameter) from the wafer's center at the axis of rotation. The single non-orthogonal stream of gas may be dispensed gradually across the wafer, by moving the nozzle in a linear motion, so that the stream crosses through the center of the wafer and to the edge of the wafer. In certain embodiments, the cleaning liquid may be applied at approximately 1600 to about 2000 cubic centimeters (cc) pers second and the gas may be dispensed at about 0.2 to about 0.2 pascals of pressure.

In certain embodiments, automated wafer cleaning may be applied after and/or in-between wafer processing, such between or after etching is performed on the wafer. Automated wafer cleaning may perform wafer cleaning in an automated manner that is more effective than cleaning utilizing conventional techniques.

Figure 1A:
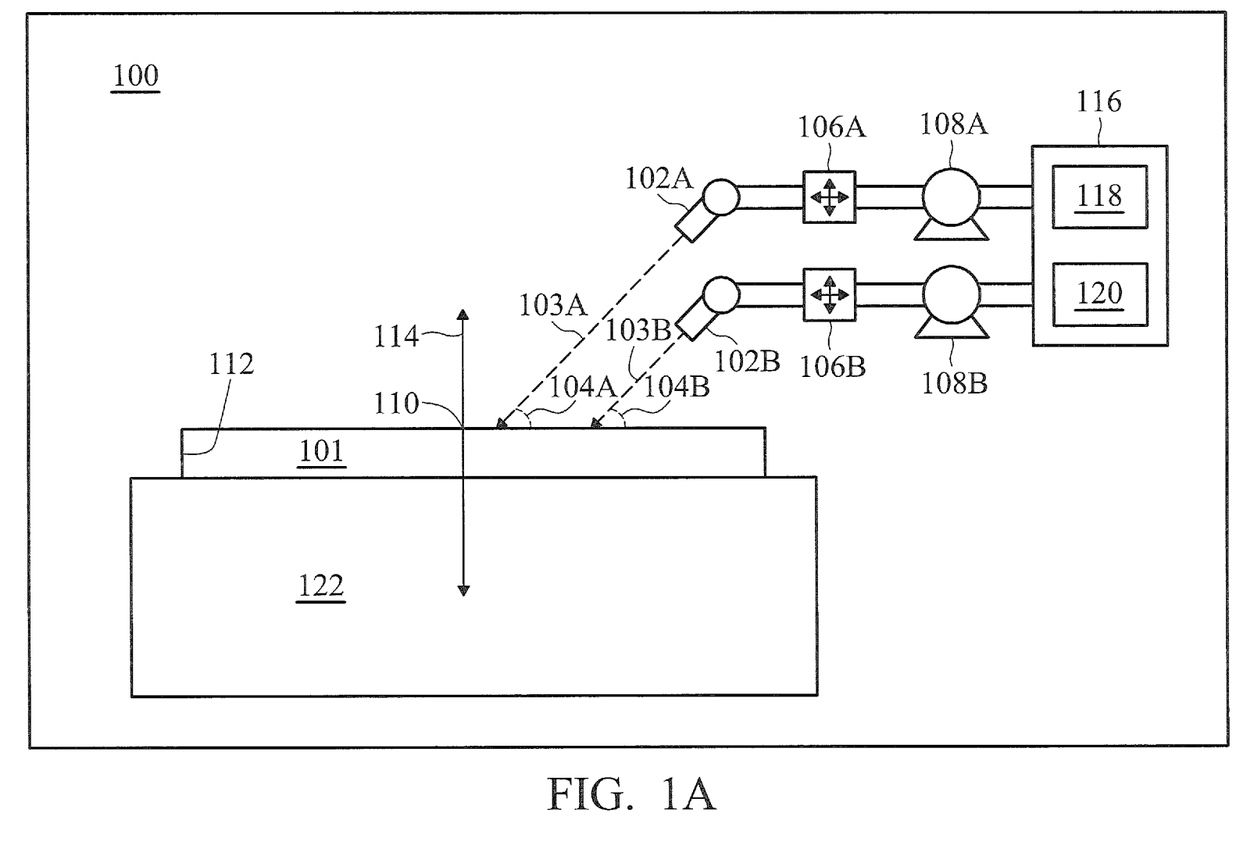
FIG. 1A is a diagram of a cleaning chamber with variable angle dispensing nozzles, in accordance with some embodiments.

FIG. 1A is a diagram of a cleaning chamber 100 with variable angle dispensing nozzles 102A, 102B over a wafer 101, in accordance with some embodiments. The variable angle dispensing nozzles 102A, 102B may be configured to dispense a cleaning substance such that a stream 103A, 103B of the cleaning substance is incident upon a wafer 103 at a particular incident angle 104A, 104B. The technique of positioning the variable angle dispensing nozzles 102A, 102B to achieve a particular incident angle is conventional and will not be discussed in detail herein for brevity.

Each of the variable angle dispensing nozzles 102A, 102B may be associated with a respective actuator 106A, 106B and pump 108A, 108B. In certain embodiments, the respective pump 108A, 108B may include a valve or may be implemented as either singularly a valve or a pump.

The actuators 106A, 106B may be configured to move an associated variable dispensing nozzle 102A, 102B to a particular location within the cleaning chamber 100. For example, the actuators 106A, 106B may be configured to move an associated variable dispensing nozzle 102A, 102B in a linear motion, so that a respective stream 103A, 103B may cross through a center 110 of the wafer 101 and to an edge 112 of the wafer 101. Other motions for the variable dispensing nozzle 102A, 102B are possible and will be discussed in further detail below. In certain embodiments, the center 110 of the wafer may also align with the axis of rotation 114 for the wafer.

Each of the variable angle dispensing nozzles 102A, 102B may be connected with a source 116 for cleaning substances. As noted above, the cleaning substances may include a cleaning liquid 118 and/or a cleaning gas 120. In certain embodiments, the cleaning liquid 118 may be deionized water and the cleaning gas 120 may be nitrogen ($N_2$) gas or isopropyl alcohol (IPA).

As noted above, the wafer 101 may be configured to spin within the cleaning chamber 100. Accordingly, the wafer 101 may rest on a chuck that is connected to a motor that produces a spinning motion for the chuck that causes the wafer 101 on the chuck 122 to spin. Furthermore, by applying a cleaning substance to a spinning wafer, a cleaning substance need not be applied along more than one axis to be applied to the entire spinning wafer 101. For example, a cleaning substance may be applied to an entire spinning wafer when the cleaning substance is applied along a stationary radius of the spinning wafer. Furthermore, application of nonorthogonal streams of the cleaning substance to the spinning wafer may produce an amount of force to the wafer 101 to more easily dislodge and remove undesirable artifacts than if the cleaning substance was not applied at a nonorthogonal stream. For example, the nonorthogonal stream of cleaning substance may provide a lateral force that may be compounded with the angular momentum of the spinning wafer to dislodge and remove an undesirable artifact on the surface of the wafer 101.

Figure 1B:
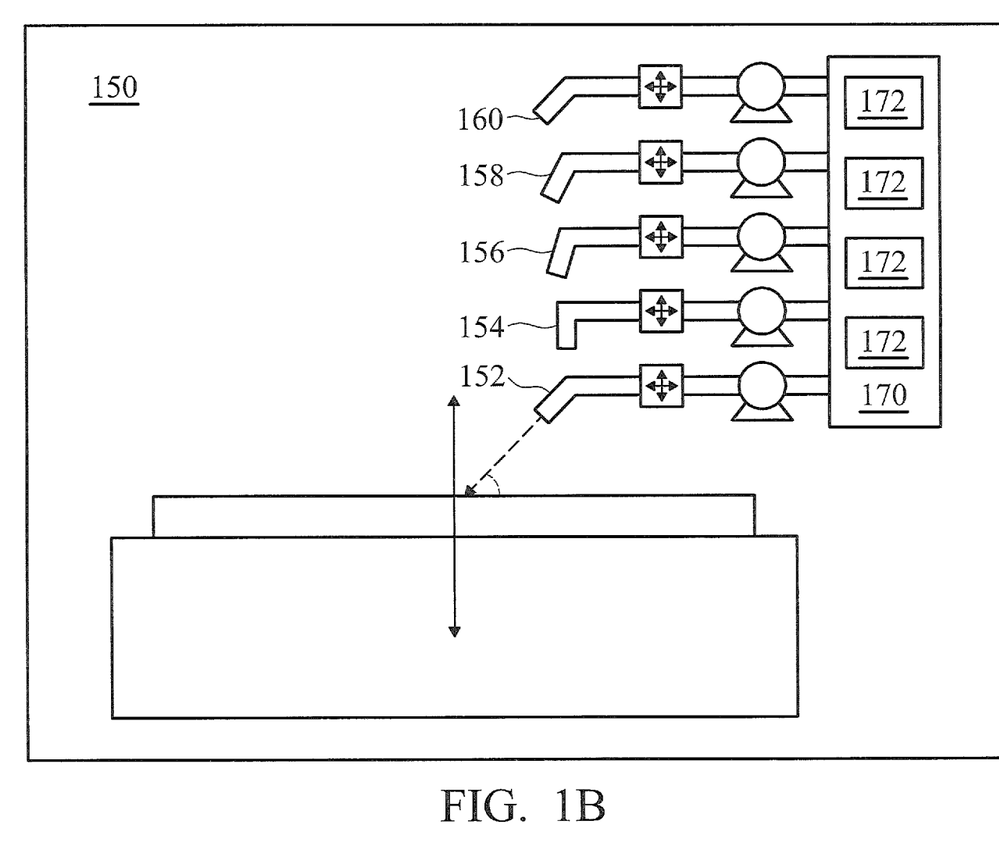
FIG. 1B is a diagram of a cleaning chamber with set angle dispensing nozzles, in accordance with some embodiments.

FIG. 1B is a diagram of a cleaning chamber 150 with set angle dispensing nozzles, in accordance with some embodiments. Various aspects of FIG. 1B are similar to FIG. 1A and will not be discussed in detail herein for brevity. However, in contrast with FIG. 1A, FIG. 1B includes multiple set angle dispensing nozzles 152, 154, 156, 158, 160 that all have different angles which may be utilized in the cleaning chamber 150. Also, each of the set angle dispensing nozzles 152, 154, 156, 158, 160 may be in fluid communication with a source 170 for cleaning substances. The source 170 for cleaning substances of FIG. 1B may differ from the source 116 for cleaning substrates of FIG. 1A as, in FIG. 1B, the source 170 for cleaning substrates may include multiple different cleaning liquids or cleaning gases 172. These different cleaning liquids and/or cleaning gases 172 may be interfaced with a particular one of the multiple set angle dispensing nozzles 152, 154, 156, 158, 160 to dispense a particular cleaning substance as discussed above.

Figure 2:
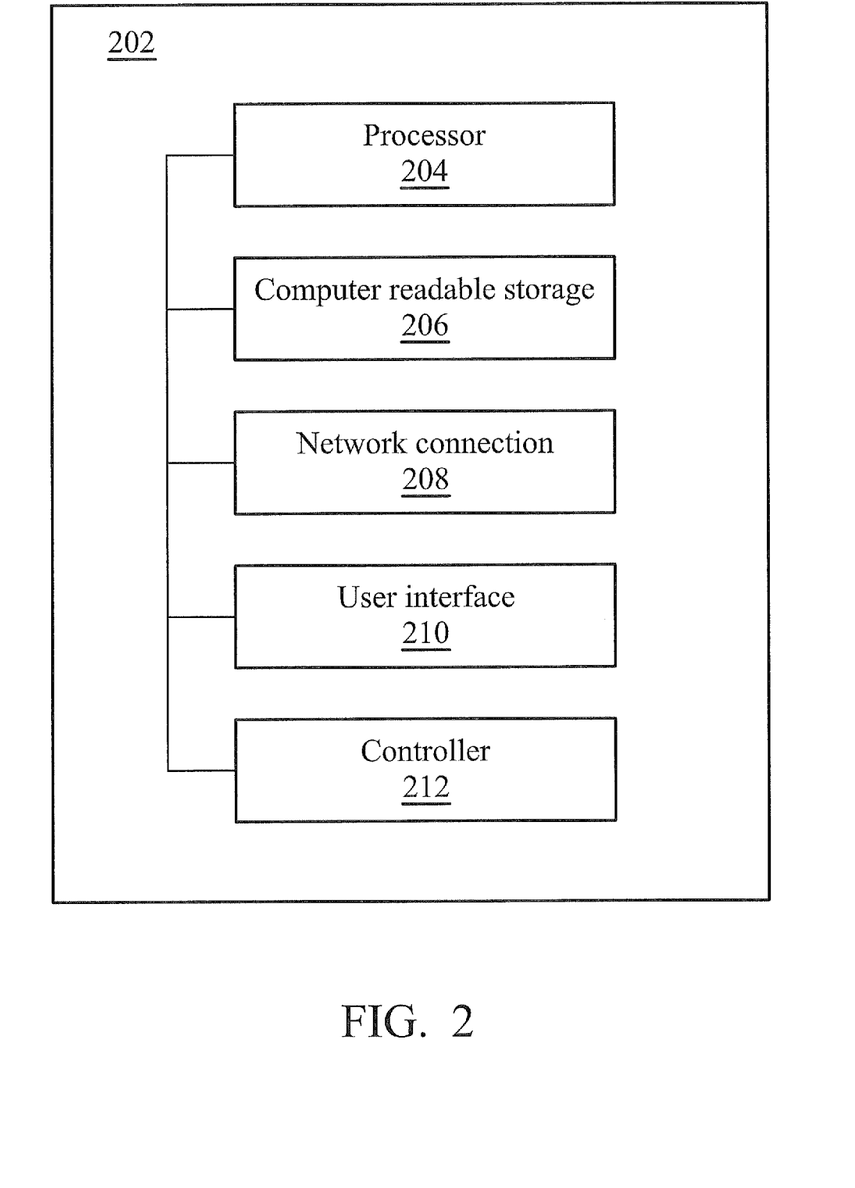
FIG. 2 is a block diagram of various functional modules of an automated wafer cleaning system, in accordance with some embodiment.

FIG. 2 is a block diagram of various functional modules of a cleaning chamber 202, in accordance with some embodiment. These functional modules may be present in addition to the various features of the cleaning chamber discussed above. The cleaning chamber 202 may include a processor 204. In further embodiments, the processor 404 may be implemented as one or more processors.

The processor 204 may be operatively connected to a computer readable storage 206 (e.g., a memory and/or data store), a network connection 208, a user interface 210, and a controller 212. In some embodiments, the computer readable storage 206 may include process logic that may configure the processor 204 to perform the various processes discussed herein. The computer readable storage may also store data, such as identifiers for a wafer, identifiers for an actuator, identifiers for a pump, identifiers for a nozzle, and/or identifiers for automated wafer cleaning for performance within a cleaning chamber, and any other parameter or information that may be utilized to perform the various processes discussed herein.

The network connection 208 may facilitate a network connection of the workstation with various devices and/or components of the workstation that may communicate within or external to the cleaning chamber 202. In certain embodiments, the network connection 208 may facilitate a physical connection, such as a line or a bus. In other embodiments, the network connection 208 may facilitate a wireless connection, such as over a wireless local area network (WLAN) by using a transmitter, receiver, and/or transceiver. For example, the network connection module 208 may facilitate a wireless or wired connection with the processor 204 and the controller 212.

The cleaning chamber 202 may also include a user interface 210. The user interface may include any type of interface for input and/or output to an operator of the workstation, including, but not limited to, a monitor, a laptop computer, a tablet, or a mobile device, etc.

The cleaning chamber 202 may include a controller 212. The controller 212 may be configured to control various physical apparatuses that control movement or functionality of the cleaning chamber 202, such as for an actuator, a cylinder, a nozzle and/or a chuck. For example, the controller 212 may control a motor that may move an actuator, a cylinder, a nozzle and/or a chuck. The controller may be controlled by the processor and may carry out the various aspects of the various processes discussed herein.

Figure 3:
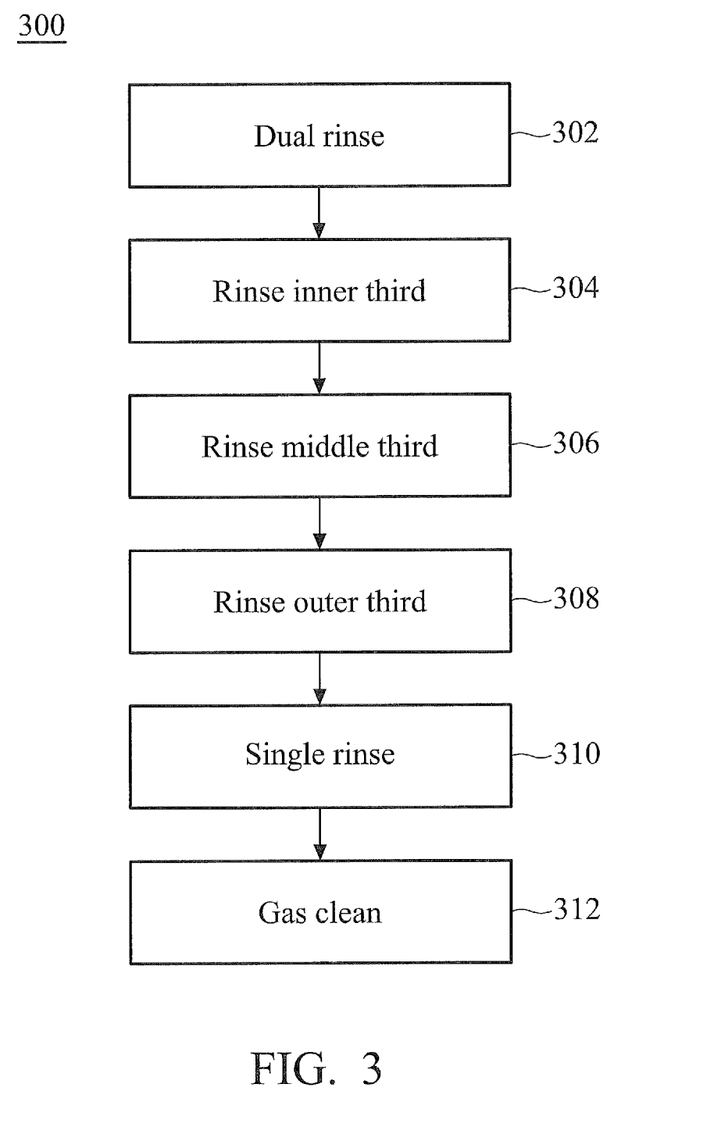
FIG. 3 is a flow chart of an automated wafer cleaning process, in accordance with some embodiments.

FIG. 3 is a flow chart of an automated wafer cleaning process 300, in accordance with some embodiments. The automated wafer cleaning process 300 may be performed by a cleaning chamber, as introduced above. It is noted that the process 300 is merely an example, and is not intended to limit the present disclosure. Accordingly, it is understood that additional operations may be provided before, during, and after the process 300 of FIG. 3, certain operations may be omitted, certain operations may be performed concurrently with other operations, and that some other operations may only be briefly described herein.

In some embodiments, operations of the process 300 may be associated with the various stages as shown in FIGS. 4A, 4B, 4C, 4D, 4E, and 4F respectively, which will be discussed in further detail below.

Referring now to FIG. 3, the process 300 starts with operation 302. At operation 302, a wafer spinning on a chuck within the cleaning chamber may be dual rinsed. By being dual rinsed, the wafer may be cleaned by being rinsed with two streams of cleaning liquid simultaneously. At operation 304, an inner third region of the wafer may be rinsed. At operation 306, a middle third of the wafer may be rinsed. At operation 308, an outer third of the wafer may be rinsed. At operation 310, the wafer may be single rinsed. At operation 312, the wafer may be gas cleaned.

In certain embodiments, each of operations 302, 304, 306, 308, 310, and 312 may be performed one immediately after another as steps of the automated wafer cleaning process of FIG. 3. In other embodiments, there may be a transition time of about 0.1 seconds to 2 seconds between the operations 302, 304, 306, 308, 310, and 312. For example, there may be a transition time of about 0.5 sections between the operations 302, 304, 306, 308, 310, and 312.

FIGS. 4A, 4B, 4C, 4D, 4E, and 4F illustrate steps of the automated wafer cleaning process of the flow chart of FIG. 3, in accordance with some embodiments. FIGS. 4A, 4B, 4C, 4D, 4E, and 4F are simplified for a better understanding of the concepts of the present disclosure. For example, although the figures illustrate a wafer, it is understood the wafer may be configured to spin within a cleaning chamber that may comprise a number of other devices such as pumps, valves, actuators, nozzles, chucks, etc., which are not shown in FIGS. 4A, 4B, 4C, 4D, 4E, and 4F, for clarity of illustration.

Figure 4A:
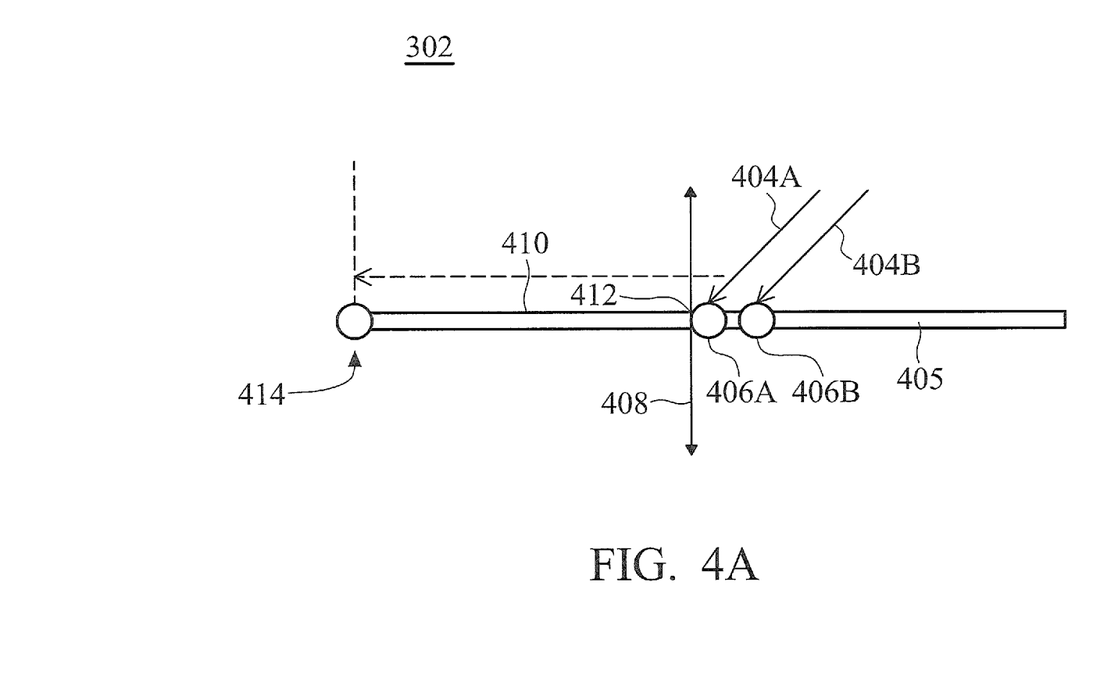
FIGS. 4A, 4B, 4C, 4D, 4E, and 4F illustrate steps of the automated wafer cleaning process of the flow chart of FIG. 3, in accordance with some embodiments.

FIG. 4A is a view of the dual clean operation 302 of FIG. 3, in accordance with some embodiments. Returning to FIG. 4A, the dual clean operation 302 may include dual streams 404A, 404B of a cleaning liquid that may be at an angle of about 5 degrees to about 85 degrees from the surface 410 of the wafer 405. For example, the dual streams 404A, 404B may be at about 60 degrees from the surface 410 of the wafer 405. In certain embodiments, the two dual streams 404A, 404B may be at the same angle from the surface 410 of the wafer 405, while in other embodiments the two dual streams 404A, 404B may be different respective angles from the surface 410 of the wafer 405.

Also, each of the dual streams may initially terminate at respective slightly offset locations 406A, 406B within about $\frac{1}{30}^{th}$ of a wafer's diameter. For example, if the wafer 405 is about 300 millimeters in diameter and about 150 millimeters in radius, the dual streams may terminate at about 151 millimeters to about 160 millimeters from an edge 414 of the wafer 405. Furthermore, in particular embodiments, the dual streams 404A, 404B may be of deionized water. However, other cleaning liquids may be utilized as desired for different applications in other embodiments.

The dual streams 404A, 404B of cleaning liquid may be dispensed across the wafer 405 in a linear motion, so that the streams 404A, 404B cross through the center point 412 of the wafer 405 and to the edge 414 of the wafer 405. In certain embodiments, the two dual streams 404A, 404B may terminate at a point beyond the edge of the wafer so that consistent momentum is applied to the stream as the stream crosses the wafer 405 in the linear motion. For example, the dual streams 404A, 404B may terminate within $\frac{1}{30}^{th}$ of the wafer's diameter beyond the edge of the wafer 405.

In particular embodiments, this step may be performed for a first duration of time. This first duration of time may be contrasted with a second duration of time that will be discussed below. This first duration of time may be, for example, about 70 seconds to about 110 seconds. In certain embodiments, this first duration of time may be about 90 seconds in duration. Also, in further embodiments, the flow of cleaning liquid may be at about 1600 cubic centimeters per second to about 2000 cubic centimeters per second. Furthermore, the wafer 405 may be rotated at a first rotational speed that may be contrasted with a second rotational speed discussed further below. The first rotational speed may be, for example, about 100 to about 300 rotations per minute. In certain embodiments, the first rotational speed may be about 200 rotations per minute. The direction of rotation may be in a counterclockwise direction or a clockwise direction.

Figure 4B:
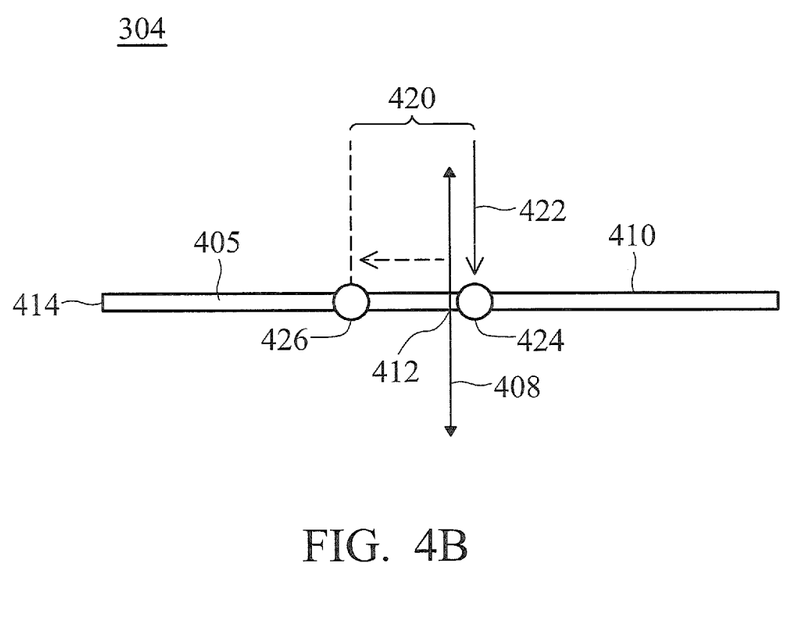

FIG. 4B is a view of the rinse inner third operation 304 of FIG. 3, in accordance with some embodiments. Returning to FIG. 4B, the rinse inner third operation 304 may include rinsing an inner third region 420 of the wafer 405. The inner third region 420 may be a region of the wafer 405 that encompasses the center point 412 or the axis of rotation 408 of the wafer 405 to an inner third boundary. The inner third boundary may be between about ⅔ of the wafer's radius from the wafer's edge 414 to about ⅗ of the wafer's radius from the wafer's edge 414. For example, if the wafer 405 is about 300 millimeters in diameter and 150 millimeters in radius, the inner third region may encompass a region that is within an inner third boundary of about 100 millimeters to about 90 millimeters of the edge 414 of the wafer 405, to the center point of the wafer 405. Stated another way, if the wafer is about 300 millimeters in diameter, the inner third region may encompass a region of the wafer that is within the inner third boundary of about 50 millimeters to about 40 millimeters of the center point to the center point of the wafer 405.

In various embodiments, the rinsing of the inner third region 420 may encompass applying a stream 422 of cleaning liquid along a straight line starting from a first point 424 along the wafer's surface 410 offset by within $\frac{1}{30}^{th}$ of a wafer's diameter from the center point 412, crossing the center point 412 and moving to an inner third region boundary point 426 along the inner third boundary. Accordingly, the rinse inner third operation not only rinses the inner third region of the wafer, but also encompasses rinsing the inner third region of the wafer in the particular manner discussed above. For example, if the wafer 405 is about 300 millimeters in diameter and 150 millimeters in radius, the first point would be about 151 millimeters to about 160 millimeters from the wafers edge 414. Also, the inner third region boundary point 426 would be about 100 millimeters to about 90 millimeters from the wafer's edge 414.

In certain embodiments, the stream 422 of cleaning liquid may be at an angle of about 10 degrees to about 95 degrees from the surface 410 of the wafer 405. For example, the stream 422 of cleaning liquid may be at about 90 degrees from the surface 410 of the wafer 405. In particular embodiments, the stream 422 of cleaning liquid may be of deionized water. However, other cleaning liquids or cleaning gases may be utilized as desired for different applications in other embodiments.

In particular embodiments, this step may be performed for a second duration of time. This second duration of time may be contrasted with the first duration of time by being shorter than the first duration of time. This second duration of time may be, for example, about 40 seconds to about 70 seconds. In certain embodiments, this first duration of time may be about 60 seconds in duration. Also, in further embodiments, the flow of cleaning liquid may be at about 1600 cubic centimeters per second to about 2000 cubic centimeters per second. Furthermore, the wafer 405 may be rotated at the first rotational speed, discussed above.

Figure 4C:
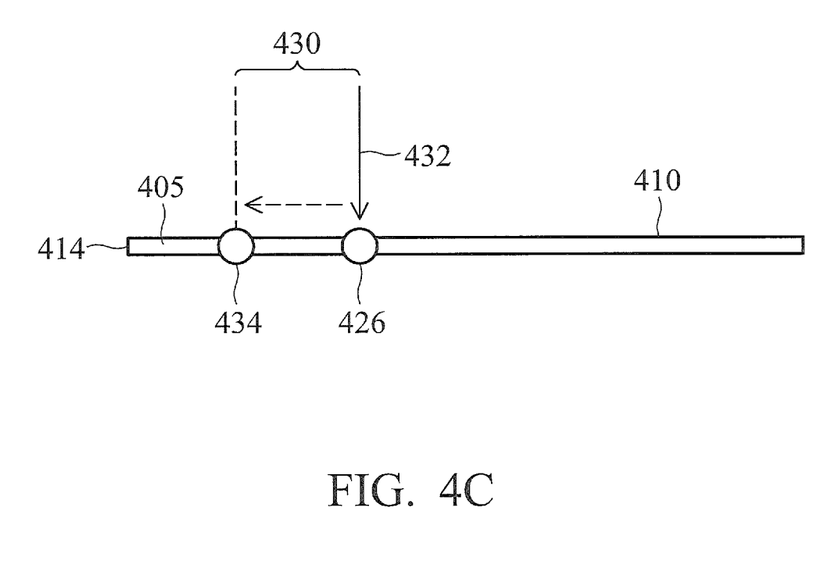

FIG. 4C is a view of the rinse middle third operation 306 of FIG. 3, in accordance with some embodiments. Returning to FIG. 4C, the rinse middle third operation 306 may include rinsing a middle third region 430 of the wafer 405. The middle third region 430 may be a region of the wafer 405 that laterally surrounds the inner third region 420 discussed above in connection with FIG. 4B. Returning to FIG. 4C, the middle third region 430 may begin (e.g., have one end point) at the inner third boundary, discussed above. Also, the middle third region 430 may end (e.g., have another end point) at a middle third boundary. The middle third boundary may be between about $\frac{4}{15}$ of the wafer's radius from the wafer's edge 414 to about $\frac{11}{30}$ of the wafer's radius from the wafer's edge 414. For example, if the wafer 405 is about 300 millimeters in diameter and 150 millimeters in radius, the middle third region may encompass a region that is within the inner third boundary, of about 100 millimeters to about 90 millimeters from the edge 414 of the wafer 405, to the middle third boundary, of about 40 millimeters to about 55 millimeters from the edge 414 of the wafer 405.

In various embodiments, the rinsing of the middle third region 430 may encompass applying a stream 432 of cleaning liquid along a straight line starting from the inner third region boundary point 426 along the inner third boundary to a middle third region boundary point 434 along the middle third boundary. For example, if the wafer 405 is about 300 millimeters in diameter and 150 millimeters in radius, the inner third region boundary point 426 would be about 100 millimeters to about 90 millimeters from the wafer's edge 414 and the middle third region boundary point 434 would be about 40 millimeters to about 55 millimeters from the wafers edge 414.

In certain embodiments, the stream 432 of cleaning liquid may be at an angle of about 10 degrees to about 95 degrees from the surface 410 of the wafer 405. For example, the stream 432 of cleaning liquid may be at about 90 degrees from the surface 410 of the wafer 405. In particular embodiments, the stream 432 of cleaning liquid may be of deionized water. However, other cleaning liquids or cleaning gases may be utilized as desired for different applications in other embodiments.

In particular embodiments, this step may be performed for the second duration of time, discussed above. Also, in further embodiments, the flow of cleaning liquid may be at about 1600 cubic centimeters per second to about 2000 cubic centimeters per second. Furthermore, the wafer 405 may be rotated at the first rotational speed, discussed above.

Figure 4D:
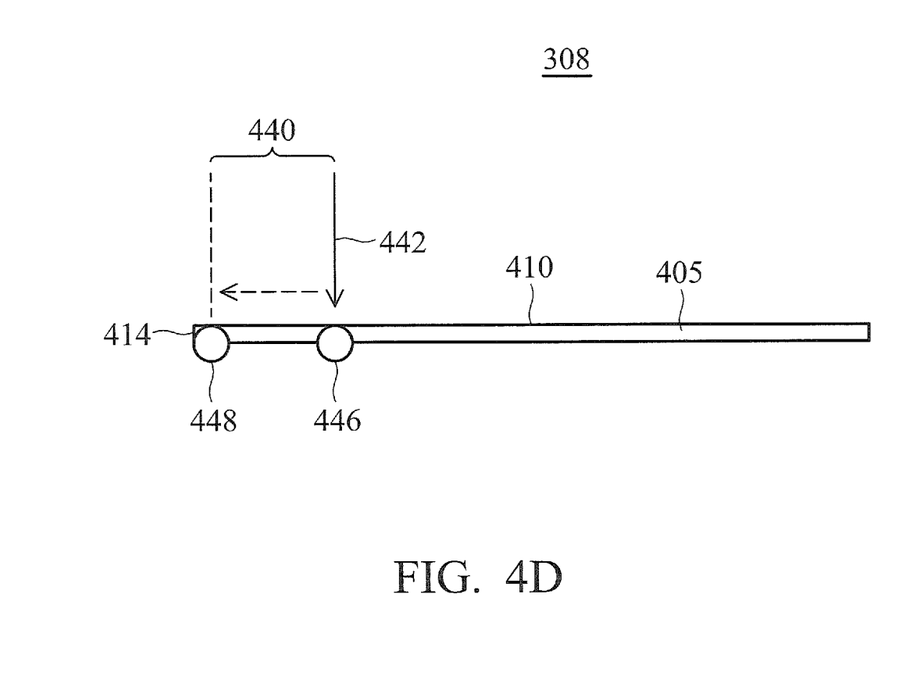

FIG. 4D is a view of the rinse outer third operation 308 of FIG. 3, in accordance with some embodiments. Returning to FIG. 4D, the rinse outer third operation 308 may include rinsing an outer third region 440 of the wafer 405. The outer third region 440 may be a region of the wafer 405 that laterally surrounds the middle third region discussed above in connection with FIG. 4C. Returning to FIG. 4D, the outer third region 440 may begin at an outer third boundary to the wafer's edge 414. The outer third boundary may be between about $\frac{4}{15}$ of the wafer's radius from the wafer's edge 414 to about ⅖ of the wafer's radius from the wafer's edge 414. For example, if the wafer 405 is about 300 millimeters in diameter and 150 millimeters in radius, the outer third region 440 may encompass a region that is from the outer third boundary, of about 40 millimeters to about 60 millimeters, to the edge 414 of the wafer 405 (e.g., 0 millimeters from the edge 414 of the wafer 405).

In various embodiments, the rinsing of the outer third region 440 may encompass applying a stream 442 of cleaning liquid along a straight line starting from an extended outer third region boundary point 446 along the extended outer third boundary to an edge point 448 along the edge 414 of the wafer 405. For example, if the wafer 405 is about 300 millimeters in diameter and 150 millimeters in radius, the extended outer third region boundary point 446 would be about 40 millimeters to about 60 millimeters from the wafer's edge 414.

In certain embodiments, the stream 442 of cleaning liquid may be at an angle of about 10 degrees to about 95 degrees from the surface 410 of the wafer 405. For example, the stream 422 of cleaning liquid may be at about 90 degrees from the surface 410 of the wafer 405. In particular embodiments, the stream 432 of cleaning liquid may be of deionized water. However, other cleaning liquids or cleaning gases may be utilized as desired for different applications in other embodiments.

In particular embodiments, this step may be performed for the first duration of time, discussed above. Also, in further embodiments, the flow of cleaning liquid may be at about 1600 cubic centimeters per second to about 2000 cubic centimeters per second. Furthermore, the wafer 405 may be rotated at the first rotational speed, discussed above.

Figure 4E:
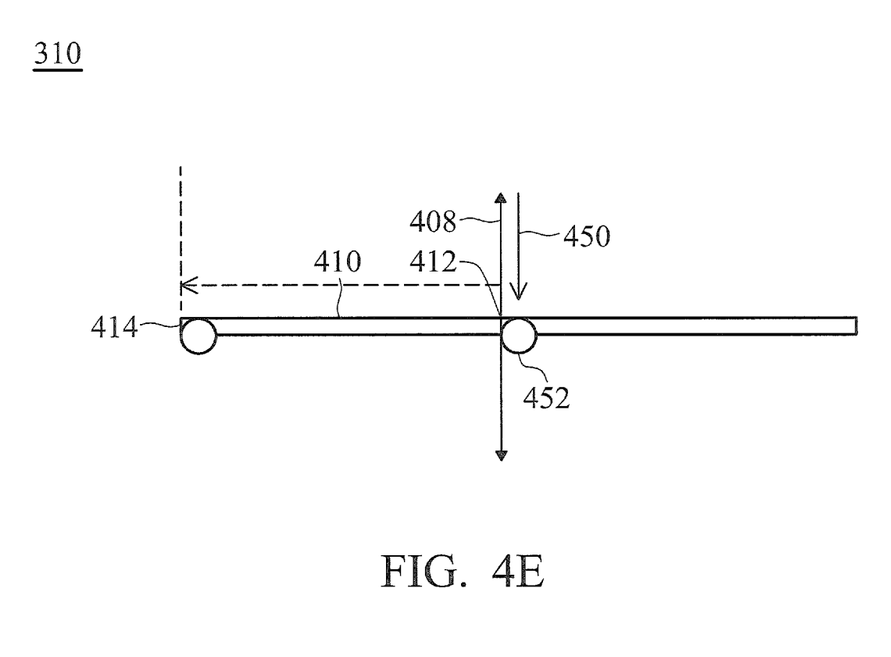

FIG. 4E is a view of the single rinse operation 310 of FIG. 3, in accordance with some embodiments. Returning to FIG. 4E, a single stream 450 of cleaning liquid may be dispensed to initially terminate at a single stream initial location 452 that is slightly offset from the wafer's 405 axis of rotation 408 at the center point 412 of the wafer 405. The single stream initial location 452 may be offset within about $1/30^{th}$ of a wafer's diameter from the center point 412. For example, if the wafer 405 is about 300 millimeters in diameter, the single stream initial location 452 may terminate at about 151 millimeters to about 160 millimeters from the edge 414 of the wafer 405. In certain embodiments, the single stream 450 may be at 155 millimeters from the edge 414 of the wafer 405.

The single stream 450 of cleaning liquid may be dispensed across the wafer 405 in a linear motion, so that the single stream 450 crosses through the center point 412 of the wafer 405 and to the edge 414 of the wafer 405 (e.g., 0 millimeters from the edge of the wafer). In certain embodiments, the single stream 450 may terminate at a point beyond the edge of the wafer so that consistent momentum is applied to the stream as the stream crosses the wafer 405. For example, the single stream 450 may terminate within $1/30^{th}$ of the wafer's diameter beyond the edge 414 of the wafer 405.

In certain embodiments, the single stream 450 may be at an angle of about 10 degrees to about 95 degrees from the surface 410 of the wafer 405. For example, the single stream 450 may be at about 90 degrees from the surface 410 of the wafer 405. Furthermore, in particular embodiments, the single stream 450 may be of deionized water. However, other cleaning liquids may be utilized as desired for different applications in other embodiments.

In particular embodiments, this step may be performed for the second duration of time, discussed above. Also, in further embodiments, the flow of cleaning liquid may be at about 1600 cubic centimeters per second to about 2000 cubic centimeters per second. Furthermore, the wafer 405 may be rotated at the first rotational speed, discussed above.

Figure 4F:
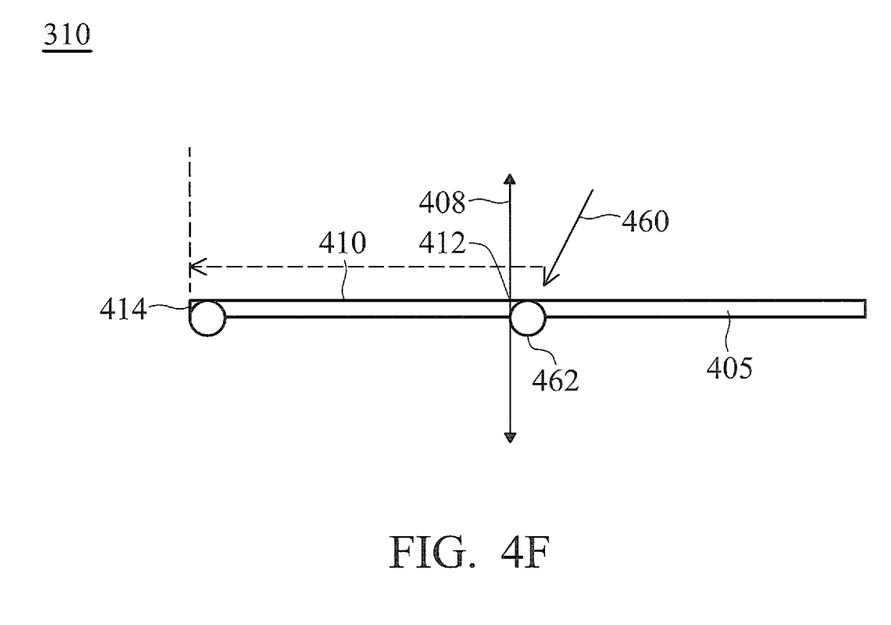

FIG. 4F is a view of the gas clean operation 310 of FIG. 3, in accordance with some embodiments. Returning to FIG. 4F, a single gas stream 460 of cleaning gas may be dispensed to initially terminate at a single gas stream initial location 462 that is slightly offset from the wafer's 405 axis of rotation 408 at the center point 412 of the wafer 405. The single gas stream initial location 462 may be offset within about $1/30^{th}$ of a wafer's diameter from the center point 412. For example, if the wafer 405 is about 300 millimeters in diameter, the single gas stream initial location 462 may terminate at about 151 millimeters to about 160 millimeters from the edge 414 of the wafer 405.

The single gas stream 460 of cleaning gas may be dispensed across the wafer 405 in a linear motion, so that the single gas stream 460 crosses through the center point 412 of the wafer 405 and to the edge 414 of the wafer 405 (e.g., 0 millimeters from the edge of the wafer). In certain embodiments, the single gas stream 460 may terminate at a point beyond the edge of the wafer so that consistent momentum is applied to the single gas stream 460 as the single gas stream 460 crosses the wafer 405. For example, the single gas stream 460 may terminate within $1/30^{th}$ of the wafer's diameter beyond the edge 414 of the wafer 405.

In certain embodiments, the single gas stream 460 may be at an angle of about 5 degrees to about 85 degrees from the surface 410 of the wafer 405. Furthermore, in particular embodiments, the single gas stream 460 may be of nitrogen ($N_2$) gas or isopropyl alcohol (IPA). The nitrogen ($N_2$) gas or isopropyl alcohol (IPA) may be dispensed at about 0.2 to about 0.3 pascals of pressure. However, other cleaning gases may be utilized as desired for different applications in other embodiments.

Also, in further embodiments, the wafer 405 may be rotated at a second rotational speed, which is faster than the first rotational speed. The second rotational speed may be, for example, about 1000 to about 3000 rotations per minute. In certain embodiments, the second rotational speed may be about 1900 rotations per minute. The direction of rotation may be in a counterclockwise direction or a clockwise direction.

In particular embodiments, this step may be performed multiple times (e.g., looped) back to back, with each performance of the step performed for a third duration of time. The number of times (e.g., loops) may be from 2 times to 10 times. In certain embodiments, the this step may be performed 5 times back to back. The third duration of time may be less than the first duration of time or the second duration of time. For example, this third duration of time may be from 1 second to 5 seconds. In certain embodiments, this third duration of time may be about 3 seconds in duration.

In an embodiment, a method includes: spinning a wafer around an axis of rotation at a center of the wafer; applying a first stream of liquid along a line starting from an initial point on the wafer adjacent to the center of the wafer, through the center of the wafer, and ending at an edge of the wafer; applying a second stream of liquid to an inner third of the line starting at the initial point and ending at a boundary point; applying a third stream of liquid to a middle third of the line starting at the boundary point; applying a fourth stream of liquid to an outer third of the line ending at the edge of the wafer; applying a fifth stream of liquid along the line starting from the initial point and ending at the edge of the wafer; and applying a stream of gas along the line starting from the initial point and ending at the edge of the wafer.

In another embodiment, a method includes: spinning a wafer around an axis of rotation at a center of the wafer; applying a first stream of liquid along a line starting from an initial point on the wafer adjacent to the center of the wafer, through the center of the wafer, and ending at an edge of the wafer; applying a second stream of liquid along the line starting from an offset point adjacent to the initial point and ending at the edge of the wafer, wherein the first stream of liquid and the second stream of liquid are applied at a same time at a first angle under 90 degrees from a surface of the wafer; and applying a stream of gas along the line starting from the initial point and ending at the edge of the wafer, wherein the stream of gas is at the first angle from the surface of the wafer.

In another embodiment, a system includes: a wafer; a chuck configured to spin the wafer around an axis of rotation at a center of the wafer; a first nozzle configured to apply a first stream of liquid along a line starting from an initial point on the wafer adjacent to the center of the wafer, through the center of the wafer, and ending at an edge of the wafer; a second nozzle configured to apply a second stream of liquid along the line starting from an offset point adjacent to the initial point and ending at the edge of the wafer, wherein the first stream of liquid and the second stream of liquid are applied at a same time at a first angle under 90 degrees from a surface of the wafer; and a third nozzle configured to apply a stream of gas along the line starting from the initial point to the edge of the wafer, wherein the stream of gas is at the first angle from the surface of the wafer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according to embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a wafer;
a chuck configured to spin the wafer around an axis of rotation at a center of the wafer;
a first nozzle configured to apply a first stream of liquid along a line starting from an initial point on the wafer adjacent to the center of the wafer, through the center of the wafer, and ending at an edge of the wafer;
a second nozzle configured to apply a second stream of liquid along the line starting from an offset point adjacent to the initial point and ending at the edge of the wafer, wherein the first stream of liquid and the second stream of liquid are applied at a same time at a first angle under 90 degrees from a surface of the wafer; and
a third nozzle configured to apply a stream of gas along the line starting from the initial point to the edge of the wafer, wherein the stream of gas is at the first angle from the surface of the wafer.

2. The system of claim 1, wherein the first nozzle is configured to apply a third stream of liquid along the line starting from the initial point to the edge of the wafer, wherein the third stream of liquid is applied at a second angle different than the first angle.

3. The system of claim 2, wherein the first nozzle is configured to apply the third stream of liquid for a shorter duration than the first stream of liquid.

4. The system of claim 1, wherein the first stream of liquid and the second stream of liquid comprise deionized water.

5. The system of claim 1, wherein the gas is nitrogen.

6. The system of claim 1, further comprising:
a fourth nozzle that is configured to apply a third stream of liquid along the line starting from the initial point and ending at the edge of the wafer, wherein the third stream of liquid is applied at a second angle different than the first angle.

7. A system, comprising:
a chuck configured to hold and spin a wafer around an axis of rotation at a center of the wafer; and
a plurality of nozzles configured to dispense streams of liquid or gas at predetermined angles with respect to a surface of the wafer, wherein the plurality of nozzles are configured to:
apply a first stream of liquid along a line starting from an initial point on the wafer adjacent to the center of the wafer, through the center of the wafer, and ending at an edge of the wafer;
apply a second stream of liquid to an inner third of the line starting at the initial point and ending at a boundary point;
apply a third stream of liquid to a middle third of the line starting at the boundary point;
apply a fourth stream of liquid to an outer third of the line ending at the edge of the wafer; and
apply a fifth stream of liquid along the line starting from the initial point and ending at the edge of the wafer,
wherein the first stream of liquid and the fourth stream of liquid are applied for a first duration of time, and
wherein the second stream of liquid, the third stream of liquid, and the fifth stream of liquid are applied for a second duration of time shorter than the first duration of time.

8. The system of claim 7, wherein the first stream of liquid is at a first angle under 90 degrees from a surface of the wafer, and wherein the second stream of liquid is at a second angle different than the first angle.

9. The system of claim 7, wherein the third stream of liquid is at a third angle different than the second angle.

10. The system of claim 7, wherein the fourth stream of liquid is at a fourth angle different than the first angle.

11. The system of claim 7, wherein the fifth stream of liquid is at a fifth angle different than the first angle.

12. The system of claim 7, wherein the stream of gas is at a sixth angle that is the same as the first angle.

13. A system, comprising:
a wafer chuck configured to spin a wafer around an axis of rotation at a center of the wafer; and
a plurality of nozzles configured to dispense streams of liquid or gas at predetermined angles with respect to a surface of the wafer, wherein the plurality of nozzles are configured to:
apply a first stream of liquid along a line starting from an initial point on the wafer adjacent to the center of the wafer, through the center of the wafer, and ending at an edge of the wafer;
apply a second stream of liquid along the line starting from an offset point adjacent to the initial point and ending at the edge of the wafer, wherein the first stream of liquid and the second stream of liquid are applied at a same time at a first angle under 90 degrees from a surface of the wafer; and
apply a stream of gas along the line starting from the initial point and ending at the edge of the wafer, wherein the stream of gas is at the first angle from the surface of the wafer.

14. The system of claim 13, wherein the wafer chuck is further configured to:
spin the wafer at a first speed while the first and second streams are applied onto the surface of the wafer; and
spin the wafer at a second speed faster than the first speed while the stream of gas is applied.

15. The system of claim 13, wherein the plurality of nozzles are further configured to apply the stream of gas multiple times along the line.

16. The system of claim 13, wherein the first stream of liquid is applied for a longer duration than the stream of gas.

17. The system of claim 13, wherein the plurality of nozzles are further configured to apply a third stream of liquid along the line starting from the initial point to the edge of the wafer, wherein the third stream of liquid is applied at a second angle different than the first angle.

18. The system of claim 17, wherein the plurality of nozzles are further configured to:
apply a fourth stream of liquid onto the wafer; and
apply a fifth stream of liquid onto the wafer, wherein the first stream of liquid and the fourth stream of liquid are applied for a first duration of time, and wherein the second stream of liquid, the third stream of liquid, and the fifth stream of liquid are applied for a second duration of time shorter than the first duration of time.

19. The system of claim 18, wherein the first stream of liquid is applied at a first angle under 90 degrees from a surface of the wafer, and the second stream of liquid is applied at a second angle under 90 degrees from a surface of the wafer, wherein the first angle is different from the second angle.

20. The system of claim 19, wherein the third stream of liquid is at a third angle different than the second angle.

* * * * *